(12) United States Patent  
Tekletsadik et al.

(10) Patent No.: US 7,675,046 B2
(45) Date of Patent: Mar. 9, 2010

(54) TERMINAL STRUCTURE OF AN ION IMPLANTER

(75) Inventors: Kasegn D. Tekletsadik, Rexford, NY (US); Russell J. Low, Rowley, MA (US)

(73) Assignee: Varian Semiconductor Equipment Associates, Inc, Gloucester, MA (US)

( * ) Notice: Subject to any disclaimer, the term of this patent is extended or adjusted under 35 U.S.C. 154(b) by 466 days.

(21) Appl. No.: 11/527,842

(22) Filed: Sep. 27, 2006

(65) Prior Publication Data

US 2008/0073578 A1 Mar. 27, 2008

(51) Int. Cl.
*H01J 37/317* (2006.01)

(52) U.S. Cl. .............. 250/492.21; 250/492.2; 250/493.1; 250/423 R; 250/515.1

(58) Field of Classification Search .......... 250/492.1, 250/492.2, 492.21, 493.1, 496.1, 503.1, 506.1, 250/515.1, 423 R, 424

See application file for complete search history.

(56) References Cited

U.S. PATENT DOCUMENTS

| 3,414,702 | A | * | 12/1968 | Stauffer | 219/121.27 |
| 4,255,615 | A | | 3/1981 | Huang et al. | |
| 4,433,247 | A | | 2/1984 | Turner | |
| 5,107,202 | A | | 4/1992 | Renda | |
| 5,497,006 | A | | 3/1996 | Sferlazzo et al. | |
| 6,060,715 | A | * | 5/2000 | England et al. | 250/492.21 |
| 6,133,786 | A | * | 10/2000 | Symons | 330/44 |
| 6,137,231 | A | * | 10/2000 | Anders et al. | 315/111.21 |
| 6,180,954 | B1 | * | 1/2001 | Verrier et al. | 250/492.21 |
| 6,403,972 | B1 | * | 6/2002 | Cucchetti et al. | 250/492.21 |
| 6,476,399 | B1 | * | 11/2002 | Harrington et al. | 250/492.21 |
| 7,166,816 | B1 | * | 1/2007 | Chen et al. | 219/121.41 |
| 2002/0074509 | A1 | * | 6/2002 | Quill | 250/432 R |
| 2002/0158213 | A1 | * | 10/2002 | Matsunaga et al. | 250/492.21 |
| 2004/0022294 | A1 | | 2/2004 | Yamamori et al. | |
| 2005/0218343 | A1 | * | 10/2005 | Benveniste | 250/492.21 |
| 2007/0235663 | A1 | * | 10/2007 | Low et al. | 250/492.1 |

FOREIGN PATENT DOCUMENTS

| JP | 05082072 A | * | 4/1993 |
| JP | 06140191 | | 5/1994 |
| JP | 06140191 A | * | 5/1994 |
| WO | 20060014633 A2 | | 2/2006 |

OTHER PUBLICATIONS

Berger, L.I.: "CRC Handbook of Chemistry and Physics, Dielectric Strength of Insulating Materials", CRC Handbook of Chemistry and Physics, XX, XX, 2007, pp. 15-42.

* cited by examiner

*Primary Examiner*—David A Vanore
*Assistant Examiner*—Michael J Logie

(57) ABSTRACT

An apparatus includes a conductive structure and an insulated conductor disposed proximate an exterior portion of the conductive structure to modify an electric field about the conductive structure. The insulated conductor has an insulator with a dielectric strength greater than 75 kilovolts (kV)/inch disposed about a conductor. An ion implanter is also provided. The ion implanter includes an ion source configured to provide an ion beam, a terminal structure defining a cavity, the ion source at least partially disposed within the cavity, and an insulated conductor. The insulated conductor is disposed proximate an exterior portion of the terminal structure to modify an electric field about the terminal structure. The insulated conductor has an insulator with a dielectric strength greater than 75 kV/inch disposed about a conductor.

23 Claims, 11 Drawing Sheets

US 7,675,046 B2

TERMINAL STRUCTURE OF AN ION IMPLANTER

FIELD

This disclosure relates to ion implantation and, more particularly, to a terminal structure of an ion implanter.

BACKGROUND

Ion implantation is a standard technique for introducing impurities into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material. The ion beam may be distributed over the wafer area by beam movement, by wafer movement, or by a combination of beam and wafer movement.

An ion implanter may have a terminal structure. The terminal structure may sometimes be referred to in the art as a "terminal" or "high voltage terminal" and is fabricated of conductive material such as metal. The terminal structure may have varying geometries that define a cavity and the ion source is at least partially disposed within the cavity. The terminal structure may be energized to a terminal voltage to assist with acceleration of the ions from the ion source. The terminal structure, as well as other components and subsystems of the ion implanter, are typically surrounded by a grounded enclosure. The grounded enclosure thus protects personnel from high voltage dangers when the ion implanter is running and protects the components and sub-systems of the ion implanter.

Air has conventionally been used to insulate the terminal structure from the grounded enclosure. However, there is a constraint on the distance of the air gap between the terminal structure and the grounded enclosure since the size of the grounded enclosure is limited in the volume manufacturing of semiconductors. Accordingly, most conventional ion implanters have limited the voltage of the terminal structure to about 200 kV.

Accordingly, there is a need in the art for a terminal structure of an ion implanter capable of modifying an electric field about the terminal structure in order to energize the terminal structure to high voltages within a reasonably sized enclosure footprint.

SUMMARY

According to a first aspect, an ion implanter is provided. The ion implanter includes an ion source configured to provide an ion beam, a terminal structure defining a cavity, the ion source at least partially disposed within the cavity, and an insulated conductor. The insulated conductor is disposed proximate an exterior portion of the terminal structure to modify an electric field about the terminal structure. The insulated conductor has an insulator with a dielectric strength greater than 75 kilovolts (kV)/inch disposed about a conductor.

According to another aspect, an apparatus is provided. The apparatus includes a conductive structure, and an insulated conductor disposed proximate an exterior portion of the conductive structure to modify an electric field about the conductive structure. The insulated conductor has an insulator with a dielectric strength greater than 75 kilovolts (kV)/inch disposed about a conductor.

BRIEF DESCRIPTION OF THE DRAWINGS

For a better understanding of the present disclosure, reference is made to the accompanying drawings, in which.

DETAILED DESCRIPTION

The invention is described herein in connection with a terminal structure of an ion implanter. However, the invention can be used with other apparatus for modifying the electric field about a conductive structure. Thus, the invention is not limited to the specific embodiments described below.

Figure 1:
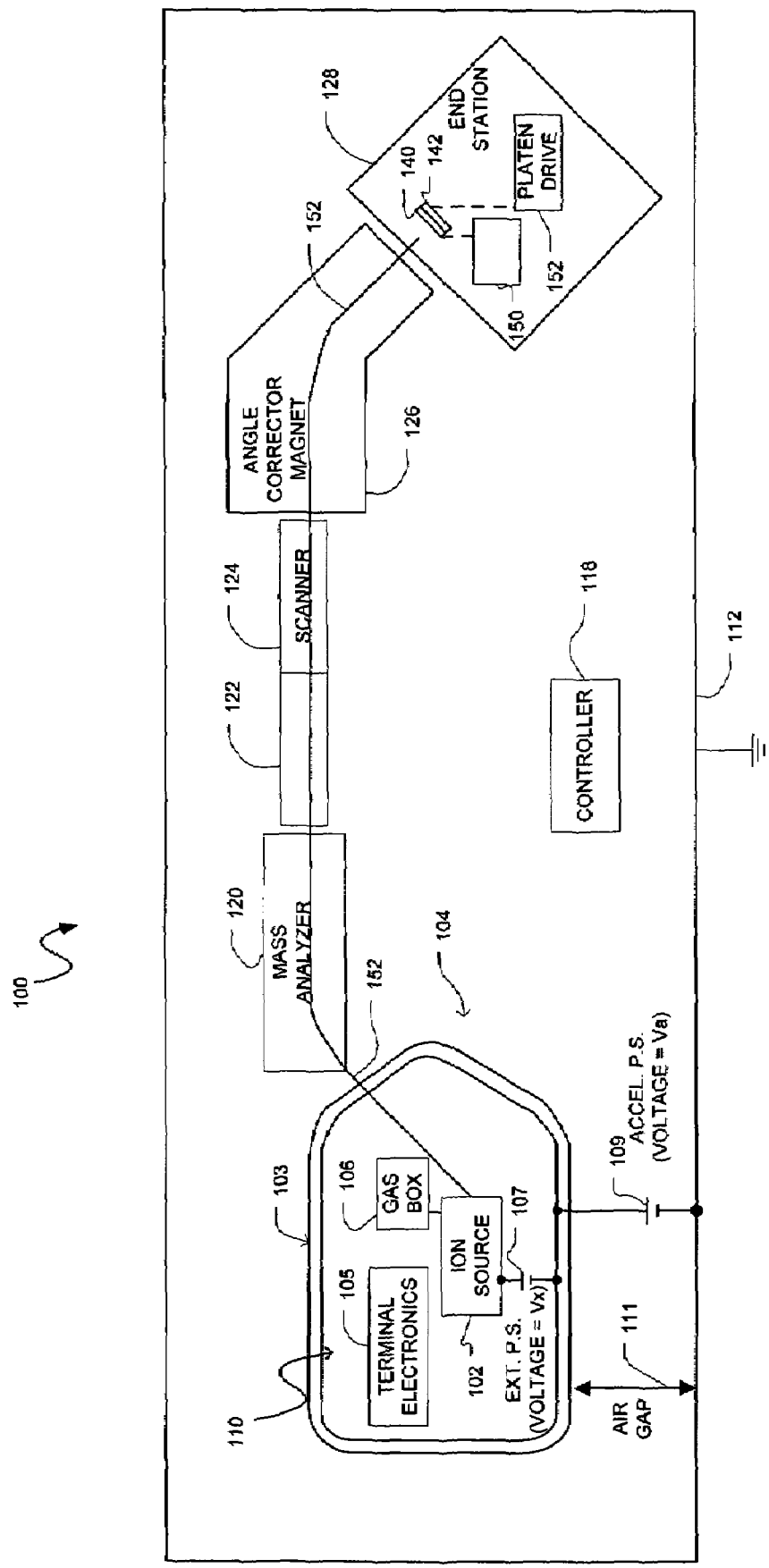
FIG. 1 is a top view of a block diagram of an ion implanter.

FIG. 1 illustrates a block diagram of an ion implanter 100 including a terminal structure 104 which may sometimes be referred to in the art as a "terminal" or a "high voltage terminal." The terminal structure 104 may be fabricated of a conductive material such as metal. The ion implanter 100 may also include an insulated conductor 103 disposed proximate an exterior portion of the terminal structure 104 to modify an electric field about the terminal structure. The terminal structure 104 and the associated insulated conductor 103 may be utilized in many different ion implanters known to those skilled in the art. Thus, the ion implanter 100 of FIG. 1 is but one embodiment of an ion implanter.

The ion implanter 100 may further include an ion source 102, a gas box 106, a mass analyzer 120, a resolving aperture 122, a scanner 124, an angle corrector magnet 126, an end station 128, and a controller 118. The ion source 102 is configured to provide an ion beam 152. The ion source 102 may generate ions and may include an ion chamber that accepts gas from the gas box 106. The gas box 106 may provide a source of gas to be ionized to the ion chamber. In addition, the gas box 106 may also contain other components known in the art such as power supplies. The power supplies may include arc, filament, and bias power supplies for running the ion source 102. The construction and operation of ion sources and the gas box are well known to those skilled in the art.

The mass analyzer 120 may include a resolving magnet that deflects ions so that ions of a desired species pass through the resolving aperture 122 and undesired species do not pass through the resolving aperture 122. Although showing about a 45 degree deflection for clarity of illustration, the mass analyzer 120 may deflect ions of the desired species by 90 degrees and deflect ions of undesired species by differing amounts due to their different masses. A scanner 124 positioned downstream from the resolving aperture 122 may include scanning electrodes for scanning the ion beam. The angle corrector magnet 126 deflects ions of the desired ion species to convert diverging ion beam paths to nearly collimated ion beam paths having substantial parallel ion trajectories. In one embodiment, the angle corrector magnet 126 may deflect ions of the desired ion species by 45 degrees.

The end station 128 may support one or more wafers in the path of the ion beam 152 such that ions of the desired species are implanted into the wafer 140. The wafer 140 may be supported by a platen 142. The end station 128 may include other components and sub-systems known in the art such as a wafer handling system 150 to physically move the wafer 140 to and from the platen 142 from various holding areas. When the wafer handling system 150 moves the wafer 140 to the platen 142 from a holding area, the wafer 140 may be clamped to the platen 142 using known techniques, e.g., electrostatic wafer clamping where the wafer is clamped to the platen with electrostatic forces. The end station 128 may also include a platen drive system 152 as is known in the art to move the platen 142 in a desired way. The platen drive system 152 may be referred to in the art as a mechanical scan system.

The controller 118 may receive input data from components of the ion implanter 100 and control the same. For clarity of illustration, input/output paths from the controller 118 to components of the ion implanter 100 are not illustrated in FIG. 1. The controller 118 can be or include a general-purpose computer or network of general-purpose computers that may be programmed to perform desired input/output functions. The controller 118 can also include other electronic circuitry or components, such as application specific integrated circuits, other hardwired or programmable electronic devices, discrete element circuits, etc. The controller 118 may also include user interface devices such as touch screens, user pointing devices, displays, printers, etc. to allow a user to input commands and/or data and/or to monitor the ion implantation system 100. The controller 118 may also include communication devices and data storage devices.

The ion beam 152 provided to a surface of the wafer 140 may be a scanned ion beam. Other ion implantation systems may provide a spot beam or a ribbon beam. The spot beam in one instance may have an approximately circular cross-section of a particular diameter depending on the characteristics of the spot beam. The ribbon beam may have a large width/height aspect ratio and may be at least as wide as the wafer 140. The scanner 124 would not be required for systems using a ribbon beam or a stationary spot beam. The ion beam 152 can be any type of charged particle beam, such as an energetic ion beam used to implant the wafer 140. The wafer 140 can take various physical shapes such as a common disk shape. The wafer 140 can be a semiconductor wafer fabricated from any type of semiconductor material such as silicon or any other material that is to be implanted using the ion beam 152.

The ion source 102, the gas box 106, and the terminal electronics 105 may be positioned within the cavity 110 defined by the terminal structure 104. The terminal electronics 105 may control operation of the components within the terminal structure 104 and may also be capable of communicating with the controller 118. An extraction power supply 107 may be coupled to the ion source 102. The extraction power supply 107 may provide a voltage level (Vx) to accelerate and extract ions from the ion source 102. In one embodiment, the extraction power supply may provide a voltage (Vx) in the range of 20 kV to 120 kV.

An additional acceleration power supply 109 may be coupled between the terminal structure 104 and the grounded enclosure 112 so as to bias the terminal structure 104 at a positive voltage (Va) with respect to ground. In one embodiment, the acceleration power supply 109 may provide an additional voltage level (Va) that may have a maximum voltage in the range of 200 kV to 1,000 kV, and may be at least 400 kV in one embodiment. Accordingly, the terminal structure 104 may be energized, in some instances, to a high voltage between 200 kV and 1,000 kV. In other instances, the terminal structure 104 may not be energized at all or energized to nominal values only depending on the desired energy of the ion beam 152. Although only one acceleration power supply 109 is illustrated for clarity of illustration, two or more power supplies may be utilized to provide the desired maximum high voltage level (Va).

During operation of the ion implanter 100, the terminal structure 104 may be energized, in some instances, to at least 400 kV, e.g., 670 kV in one embodiment. The insulated conductor 103 is disposed proximate an exterior portion of the terminal structure 104 to modify an electric field about the terminal structure 104. The insulated conductor 103 includes an insulator with a dielectric strength greater than 75 kilovolts (kV)/inch disposed about a conductor. The insulated conductor 103 may drop a high proportion of the terminal voltage within the insulated conductor 103. Hence, the insulated conductor 103 reduces the electric stress in the air gap 111 and helps to promote a more uniform electric field within the air gap 111 compared to terminal structures with no such insulated conductors. In other words, the insulated conductor 103 may function as an electrical stress shield. Therefore, the terminal structure 104 may be energized to higher voltage levels, e.g., at least 600 kV as opposed to 200 kV, within the same reasonably sized grounded enclosure 112. Alternatively, for operation at the same lower terminal voltage of about 200 kV and less, the insulated conductor 103 can enable the air gap 111 to be reduced compared to air only insulation schemes.

Figure 2:
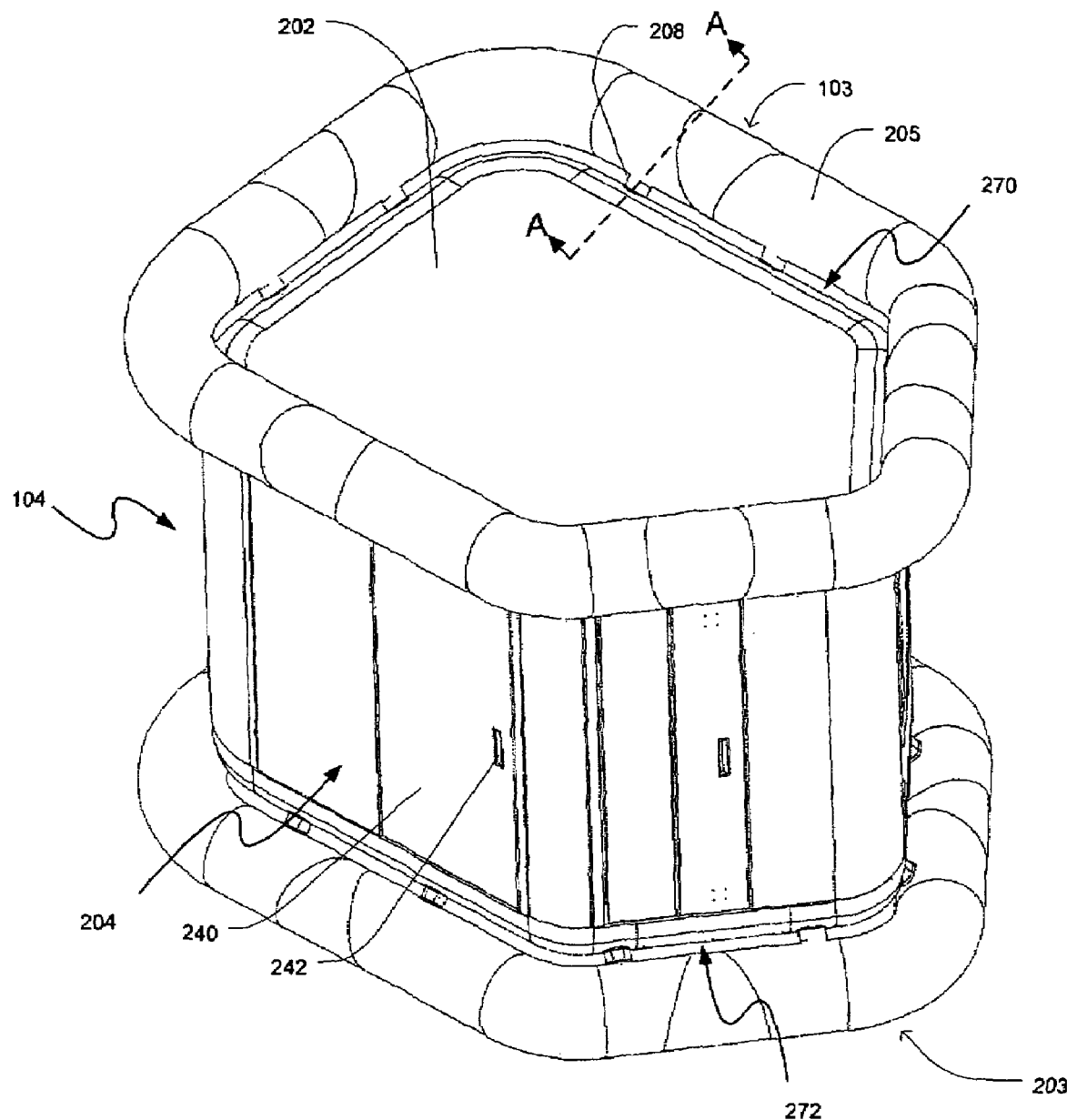
FIG. 2 is a perspective view of the terminal structure of the ion implanter of FIG. 1.

Turning to FIG. 2, a perspective view of the terminal structure 104 of FIG. 1 is illustrated. The terminal structure 104 may include a base, one or more upstanding sidewalls coupled to the base, and a top 202 coupled to the one or more upstanding sidewalls. One upstanding sidewall 204 may have a door 240 with a handle 242 to provide personnel access to the internal cavity of the terminal structure 104. The terminal structure 104 may have one upstanding sidewall manufactured of one solid material piece or any plurality of separate pieces. Although illustrated as a solid piece, the top 202 of the terminal structure may also be fabricated of a plurality of spaced conductors forming a type of conductor mesh to allow air to flow through the openings of the mesh.

In general, one or more insulated conductors may be disposed about portions of the exterior surface of the terminal structure 104 that have excess electric stress. In the embodiment of FIG. 2, a top insulated conductor 103 is disposed proximate the entire periphery of a top edge 270 of the terminal structure 104, and a bottom insulated conductor 203 is disposed proximate the entire periphery of a bottom edge 272. Although the top and bottom insulated conductors 103 and 203 are positioned about an entirety of the periphery of the respective edges 270, 272, alternative embodiments may have additional or alternative exterior portions where insulated conductors may be positioned. These portions may include, but not be limited to, horizontal edges, vertical edges, corners, and openings or interfaces where the terminal structure 104 interfaces with external parts. Some external parts may include a motor, a generator, or a utility interface. In one example, a sphere shaped insulated conductor may be positioned about a corner of the terminal structure.

A plurality of brackets may be coupled to the terminal structure 104 and the associated insulated conductors 103 and 203 to support the insulated conductors 103 and 203 proximate an exterior portion of the terminal structure. The number and position of the brackets depends on the characteristics of the insulated conductors 103 and 203, the geometry of the terminal structure 104, and the type of bracket. The brackets may have a length to enable the insulated conductors 103 and 203 to be positioned a desired distance from an exterior portion of the terminal structure 104. The desired distance may range from almost zero (nearly touching) to a maximum distance permitted by the surrounding air gap. In one embodiment, the desired distance is at least 1.5 inches. The brackets, e.g., bracket 208, may be fabricated of either conductive of nonconductive material.

Figure 3:
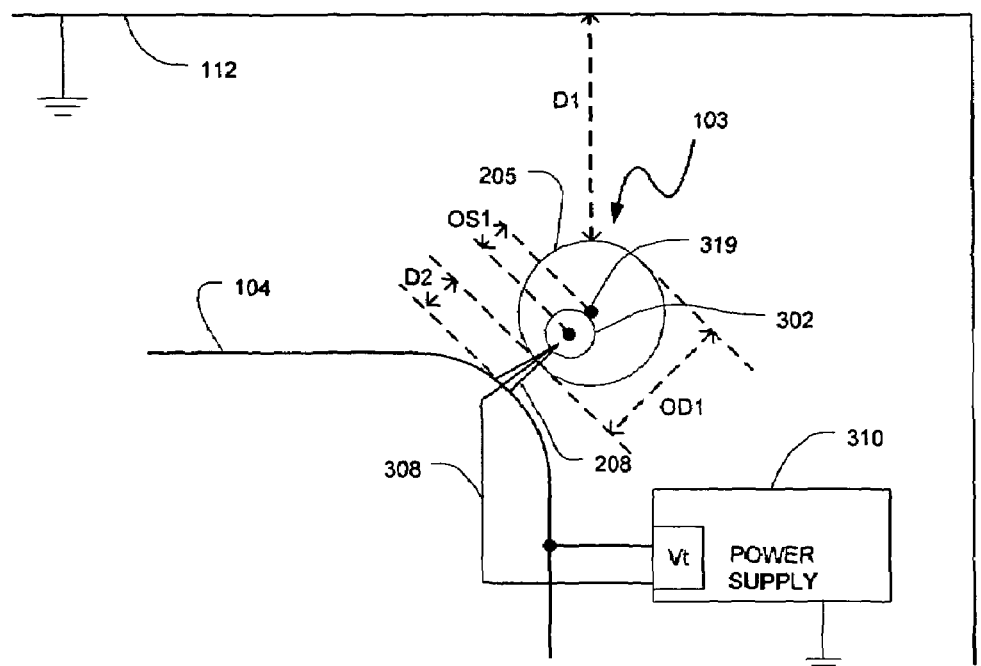
FIG. 3 is a cross sectional view of one embodiment of the insulated conductor taken along the line A-A of FIG. 2.

Turning to FIG. 3, a cross sectional view of one embodiment of the insulated conductor 103 taken along the line A-A of FIG. 2 is illustrated. The insulated conductor 103 includes an insulator 205 with a dielectric strength greater than 75 kV/inch disposed about a conductor 302. In one embodiment, the insulator 205 may be a solid insulator. The solid insulator may include, but not be limited to, syntactic foam, polytetrafluoroethylene (PTFE), chlorinated polyvinyl chloride (CPVC), polyvinylidene difluoride (PVDF), ethylene chlorotrifluoroethylene (ECTFE), polytetrafluoroethylene (PTFE), or a polyimide (e.g., kapton). The syntactic foam may include hollow glass spheres and/or polymer pellets dispersed about a filling compound such as epoxy, silicone, or resin. In one embodiment, a syntactic foam insulator had an average dielectric strength of about 300 kV/inch on test samples about 0.25 inches thick. Some other solid insulators had a dielectric strength greater than 150 kV/inch. Alternatively, the insulator 205 may have a chamber wall that defines an internal cavity and the internal cavity may be filled with a liquid insulator or a gas insulator. The liquid insulator may include, but not be limited to, oil. The gas insulator may include, but not be limited to, carbon dioxide ($CO_2$), sulphur hexafluoride ($SF_6$), or pressurized air. Some gases may not need to be pressurized depending on their non pressurized dielectric strength. Vacuum insulation and/or any combination to form a composite insulation may also be utilized. The conductor 302 may be a high voltage conductor having a solid cross section. The insulated conductor 103 can be fabricated as a single entity or composed and joined from segments of insulated conductors.

A power supply 310 may energize the terminal structure 104 and the conductor 302. In one embodiment, the power supply 310 is configured to energize the conductor 302 to a first voltage and the terminal structure 104 to the same first voltage, e.g., a terminal voltage (Vt). This terminal voltage may be at least 400 kV in one embodiment. This terminal voltage may also be a DC voltage in one instance. If the bracket 208 is fabricated of a conductive material, the power supply 310 may provide the voltage to the terminal structure 104 which may also be provided to the conductor 302 via the conductive bracket. If the bracket 208 is fabricated of a nonconductive material, a separate conductor 308 may electrically couple the power supply 310 to the conductor 302. The conductor 308 may be fed through an opening in the bracket 208. Having a separate conductor 308 also enables the conductor 302 to be energized to a different voltage level than the terminal voltage (Vt).

Non-pressurized air may be present within the grounded enclosure 112 about the terminal structure 104 and insulated conductor 103. Non-pressurized air may have a dielectric strength of less than or equal to about 75 kV/inch under assumed conditions. This dielectric strength may change with relative humidity, altitude above sea level of the particular location of the ion implanter (i.e., air pressure), separation distance, and electrode surface finish. Temperature also impacts the breakdown strength of air. Essentially the temperature and pressure (PV=nRT) changes show that what is actually changing is the air density. Air density impacts breakdown strength through pressure and temperature.

As a safety measure to account for such variations, a dielectric strength of less than or equal to about 45 kV/inch for air may be utilized as a design rule in one instance. In any event, it would be desirable to have the electric field stress at the exterior of the insulated conductor 103 reduced to a value consistent with the selected design rule for air, even if the terminal structure is energized to 600 to 1,000 kV. In this way, the remaining air gap between the insulated conductor is 103 and the grounded enclosure 112 (e.g., distance D1) would be adequate to insulate the terminal structure 104 without electrical breakdown, e.g., arcing.

The geometry of the insulated conductor 103 may therefore be selected so the electric field stress at the exterior surface of the insulated conductor is less than the selected design rule for air. In some embodiments, the outside diameter (OD1) of the insulator 205 may range between 8 inches and 16 inches depending on the dielectric strength of the particular insulator selected. The conductor 302 may have a center that is offset from the center 319 of the insulator 205 by an offset distance (OS1) ranging from 0 to about 3.0 inches depending on the available space within the insulator 205 and the diameter of the conductor 302. In one particular embodiment, the insulator 205 is syntactic foam having an outside diameter (OD1) of 11 inches, the conductor 302 has a diameter of 4 inches spaced an offset distance (OS1) of 3.0 inches from the center of the insulator 205, and the bracket has a length to enable the insulated conductor 103 to be positioned a distance (D2) of 1.5 inches from the terminal structure 104.

Figure 4:
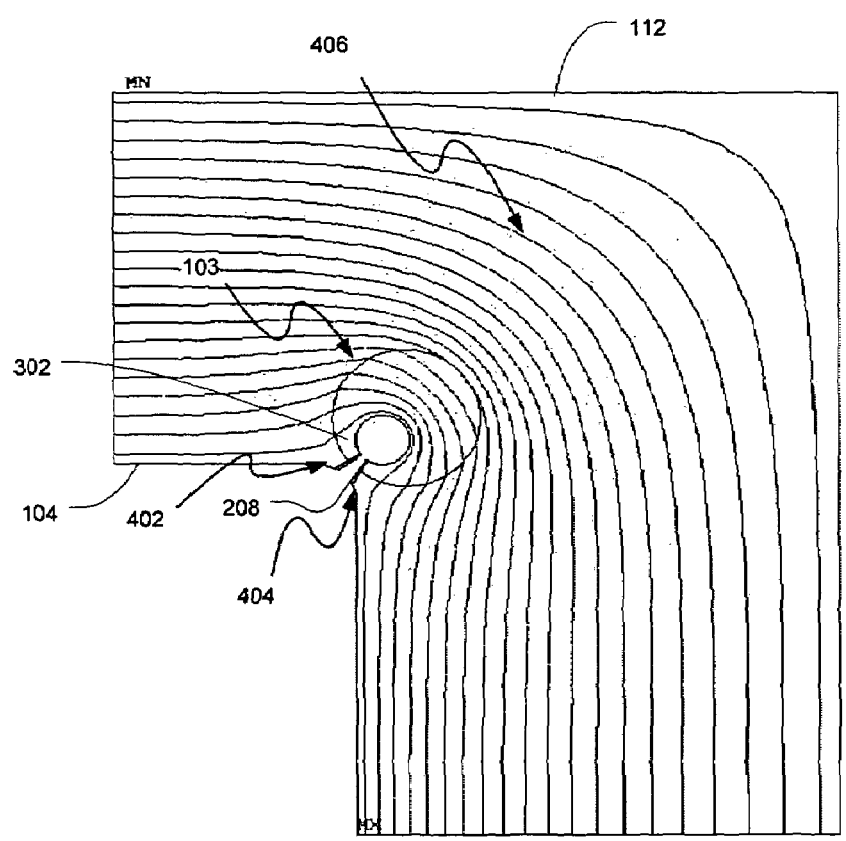
FIG. 4 is a plot of equipotential lines for an embodiment consistent with FIG. 3.

FIG. 4 illustrates plots of equipotential lines for an embodiment consistent with FIG. 3 where the conductor 302 and the terminal structure 104 are both energized to 600 kV. The insulated conductor 103 modifies the electric field about the terminal structure 104 so that areas of greater electric stress are positioned within the insulator 205 designed to accommodate this electric stress. The insulated conductor 103 also helps to reduce electric stress within the air gap 406 between the terminal structure 104 and the grounded enclosure 112 and to promote a more uniform electric field within the air gap 406 compared to terminal structures with no such insulated conductors.

The insulated conductor 103 thus operates as a type of electrical stress shield. Therefore, the terminal structure 104 may be energized to higher voltage levels, e.g., at least 600 kV as opposed to 200 kV ion one instance, within the same reasonably sized grounded enclosure 112. Alternatively, for operation at the same lower terminal voltage of about 200 kV and less as in conventional ion implanters, the insulated conductor 103 can enable the air gap 406 to be reduced compared to air only insulation schemes.

Triple point stress regions 402, 404 form where three different mediums contact each other (e.g., air, insulator 205, and a conductor where the bracket 208 is fabricated of conductive material). When the conductor 302 and the terminal structure 104 are energized to the same terminal voltage, an isopotential is created between the terminal structure and the conductor 302 and hence the electric stress at triple point stress regions 402, 404 is relatively low. This enables the mounting bracket 208 to be affixed to its location which would otherwise be a difficult connection to make in an area of higher electric stress absent the insulated conductor 103.

Figure 5A:
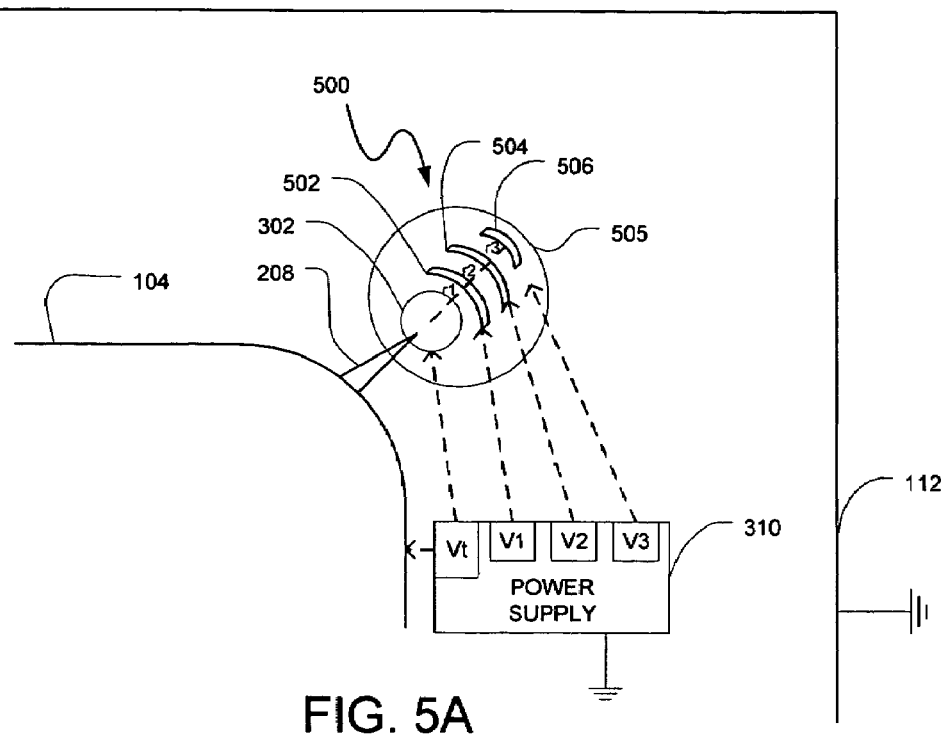
FIGS. 5A and 5B are cross sectional views of additional embodiments of the insulated conductor taken along the line A-A of FIG. 2 having a plurality of grading conductors.

FIG. 5A illustrates a cross sectional view another embodiment of an insulated conductor 500 having a plurality of grading conductors 502, 504, 506. Other components of FIG. 5A similar to earlier Figures are labeled similarly and hence any repetitive description is omitted herein for clarity. Although three s grading conductors 502, 504, 506 are illustrated, the embodiment is not limited to only three grading conductors as one or more grading conductors may be utilized. In general, the grading conductors 502, 504, 506 are a means to drop more voltage inside the insulated conductor 500 than without the grading conductors. The grading conductors 502, 504, 506 thus increase flexibility to increase the operating voltage of the terminal structure 104 or reduce the footprint of the grounded enclosure 112.

The grading conductors 502, 504, 506 may be radially disposed varying radial distances r1, r2, and r3 respectively from the conductor 302, wherein r1<r2<r3. Each of the grading conductors 502, 504, 506 may have an arcuate shape where the curved bow of the shape is generally consistent with a segment of an outside edge of the terminal structure 104 proximate the insulated conductor 500. The arcuate shape has a length that can be similar or different for each grading conductor. In the embodiment of FIG. 5A, the first and second grading conductors 502 and 504 have a similar arcuate length while the third grading conductor 506 is comparatively shorter.

The grading conductors 502, 504, 506 may be either passive or active. For passive grading, the grading conductors 502, 504, 506 are not connected to the external power supply 310, and the grading conductors are electrically floating. For active grading, the grading conductors 502, 504, 506 are connected to the external power supply 310. For clarity of illustration, the connections from the power supply 310 are illustrated as phantom lines and could be derived in any number of ways, e.g., a high voltage power supply could be divided by a resistor chain to ground with differing voltages being tapped off different positions in the resistor chain. The conductor 302, as well as the terminal structure 104, may receive a terminal voltage (Vt) from the power supply 310. The first grading conductor 502 may receive a first grading voltage (V1), the second grading conductor 504 may receive a second grading voltage (V2), and the third grading conductor 506 may receive a third grading voltage (V3) from the power supply 310, where Vt>V1>V2>V3. In one embodiment, Vt=600 kV, V1=500 kV, V2=400 kV, and V3=300 kV.

Figure 6:
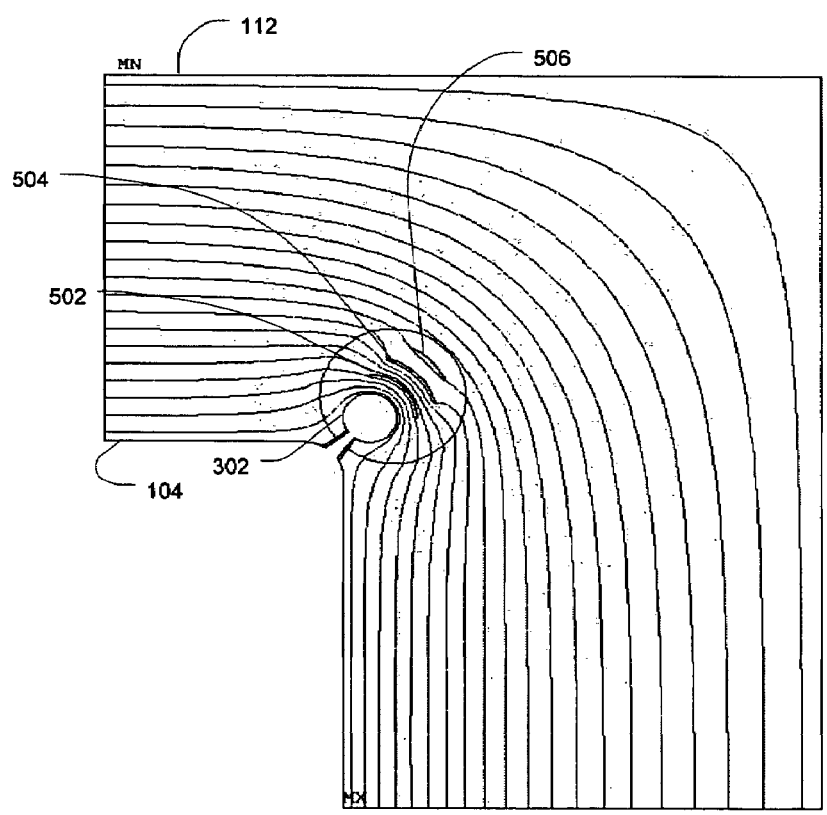
FIG. 6 is a plot of equipotential lines for an embodiment consistent with FIG. 5A.

FIG. 6 illustrates plots of equipotential lines for an embodiment consistent with FIG. 5A having active grading to illustrate how the insulated conductor 500 modifies an electric field about the terminal structure 104. The equipotential lines are concentrated in the insulator 505 which is designed to handle the electric stress. The grading conductors 502, 504, 506 enable more voltage to be dropped within the insulator 505 than without the grading conductors. In addition, the electric stress at the surface of the insulator 505 is reduced and a more uniform electrical field within the air gap between the insulated conductor 500 and the grounded enclosure 112 is promoted.

Figure 5B:
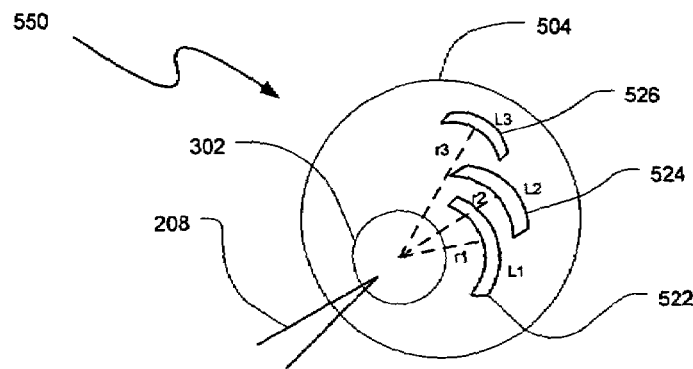

Turning to FIG. 5B, another embodiment of an insulated conductor 550 with three grading conductors 522, 524, 526 is illustrated. In general, the size and angular spacing between the grading conductors may vary depending on the particular application. In the embodiment of FIG. 5B, the three grading conductors 522, 524, 526 are radially disposed a respective radial distance r1, r2, and r3 from the conductor 302. The first grading conductor 522 has a first arcuate length (L1), the second grading conductor 534 has a second arcuate length (L2), and the third grading conductor has a third arcuate length (L3), where L1>L2>L3. In addition, radial lines from the conductor 302 to a center of each grading conductor 522, 524, 526 are at different angles from each other.

Figure 7:
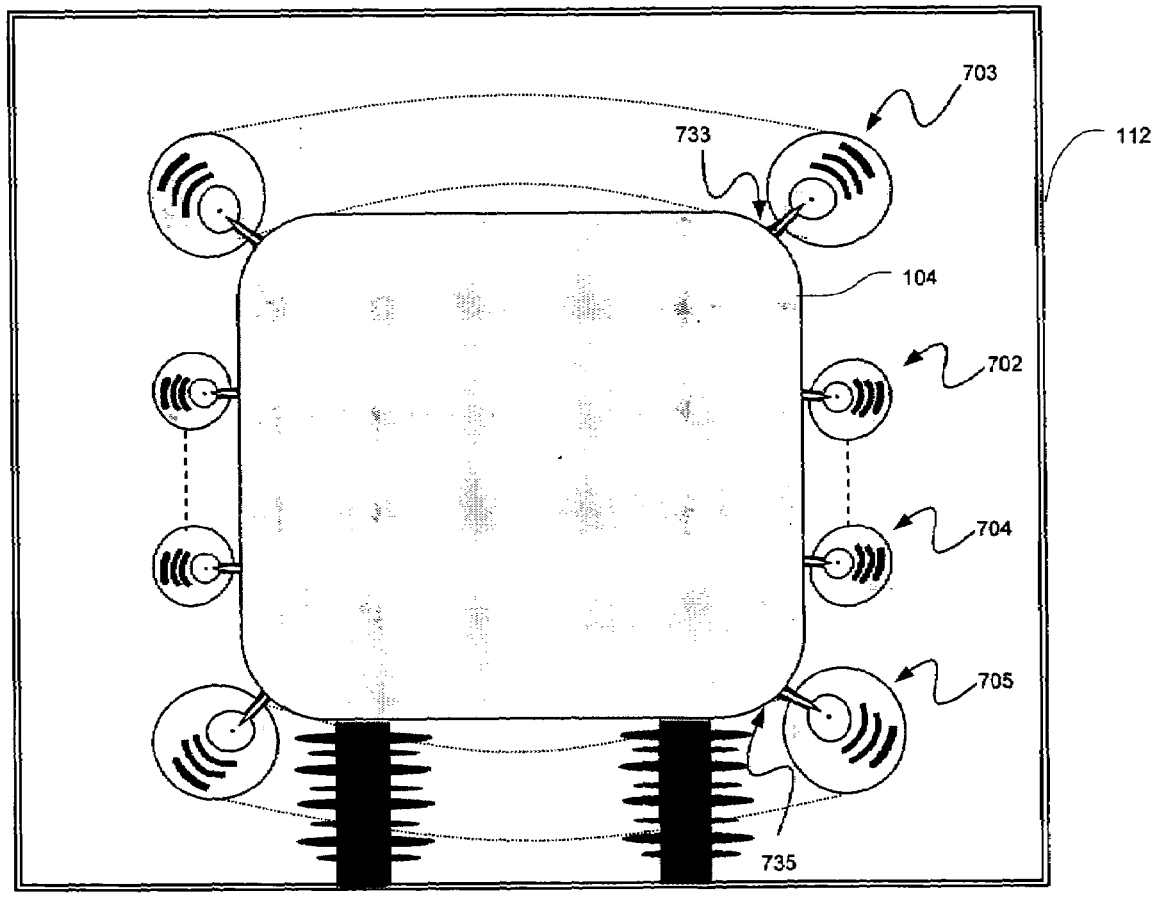
FIG. 7 is a cross sectional view of another embodiment of a terminal structure illustrating positioning of insulated conductors relative to exterior portions of the terminal structure.

Turning to FIG. 7, a cross sectional view of another embodiment of a terminal structure 104 having differing insulated conductors positioned relative to differing exterior portions of the terminal structure 104 is illustrated. Again in general, one or more insulated conductors may be disposed about portions of the exterior surface of the terminal structure 104 that have excess electric stress. In the embodiment of FIG. 7, a top insulated conductor 703 is disposed proximate a periphery of a top edge 733 of the terminal structure 104. A bottom insulated conductor 705 is disposed proximate a periphery of a bottom edge 735. A first 702 and second 704 intermediate insulated conductor may be further disposed about a periphery of the terminal structure 104 between the top edge 733 and bottom edge 735. Although each of the insulated conductors 703, 702, 704, 705 is illustrated as having three grading conductors, other embodiments may not utilize any grading conductors.

FIGS. 8-12 illustrate embodiments having a plurality of insulated conductors arranged in different configurations about the terminal structure 104. The quantity of insulated conductors, the size of the insulated conductors, and the clearance between each insulated conductor depend on the maximum operating voltage of the terminal structure 104, the dielectric strength of each insulator, and the mechanical support structure. The different configurations of FIGS. 8-12 are flexible to upgrade the system to accommodate differing terminal voltage levels. For instance, a higher operating voltage of the terminal structure may be accommodated by adding additional insulated conductors as necessary, and a lower terminal voltage may be accommodated by removing one or more of the insulated conductors. Each of the insulated conductors of FIGS. 8-12 may be consistent with any of the embodiments of insulated conductors detailed herein or may be commercially available or custom made high voltage cables.

Figure 8:
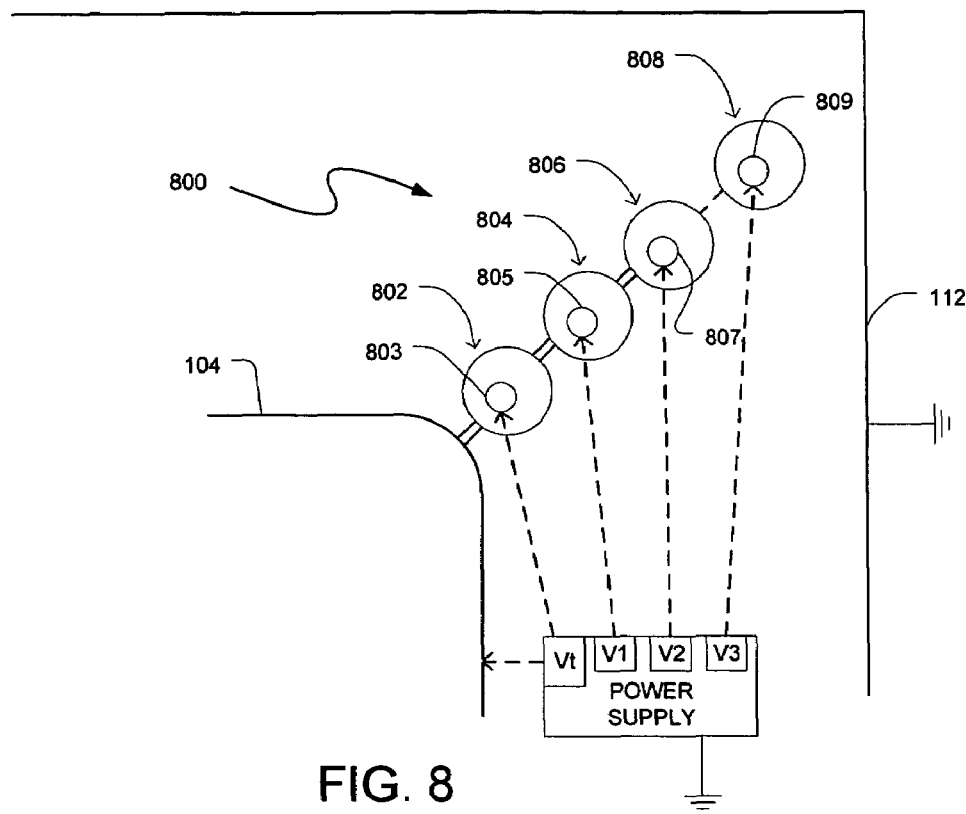
FIGS. 8 and 9 are cross sectional views of additional embodiments having a plurality of insulated conductors.

FIG. 8 illustrates a plurality of insulated conductors 802, 804, 806, and 808 disposed in a linear array 800 extending outwardly from an exterior portion of the terminal structure 104. The exterior portion of the terminal structure may be a top edge of the terminal structure where a sidewall and a top of the terminal structure meet. This edge may have an arc shape and the linear array 800 of insulated conductors may extend radially outward from the arc. Although FIG. 8 illustrates four insulated conductors 802, 804, 806, and 808, any plurality of insulated conductors may be used and insulated conductors may be added or removed to accommodate differing maximum operating voltages of the terminal structure.

The linear array 800 may be arranged for passive grading or active grading. For passive grading, conductor 803 and the terminal structure 104 may both receive a terminal voltage (Vt), e.g., 600 kV in one embodiment. The other conductors 805, 807, and 809 may be left electrically floating. For active grading, conductor 803 and the terminal structure 104 may again receive the terminal voltage (Vt), while conductors 805, 807, and 809 may receive respective voltage levels V1, V2, and V3, where Vt>V1>V2>V3.

Figure 9:
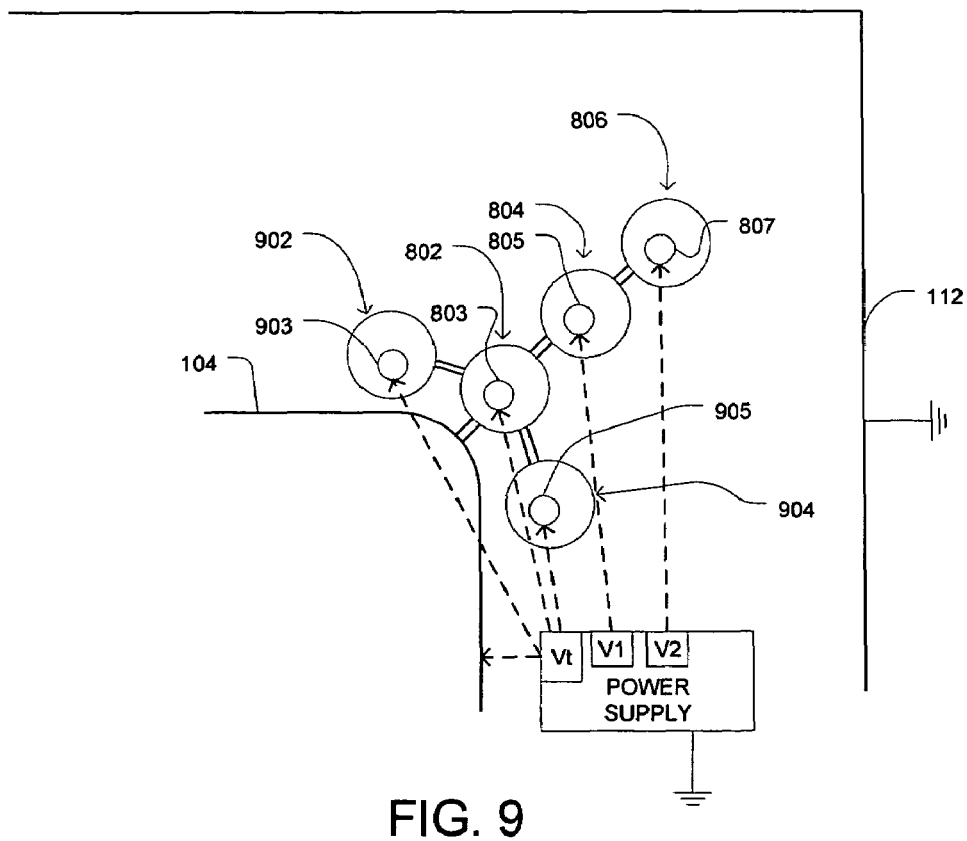

FIG. 9 illustrates another embodiment having a plurality of insulated conductors 902, 904, 802, 804, and 806. Insulated conductors 802, 804, and 806 are arranged in a linear array similar to the embodiment of FIG. 8. Insulated conductors 902, 802, and 904 are arranged in arc similar to the arcuate shape of the edge of the exterior portion of the terminal structure 104 proximate the three insulated conductors 902, 802, and 904. For active grading, conductors 903, 803, and 905 may receive the terminal voltage (Vt), while conductors 805 and 807 may receive respective voltage levels V1, V2, where Vt>V1>V2. In yet another embodiment, the insulated conductors 804 and 806 may not be present leaving only insulated conductors 902, 802, and 904 arranged in the illustrated arc about an exterior portion of the terminal structure 104.

Figure 10:
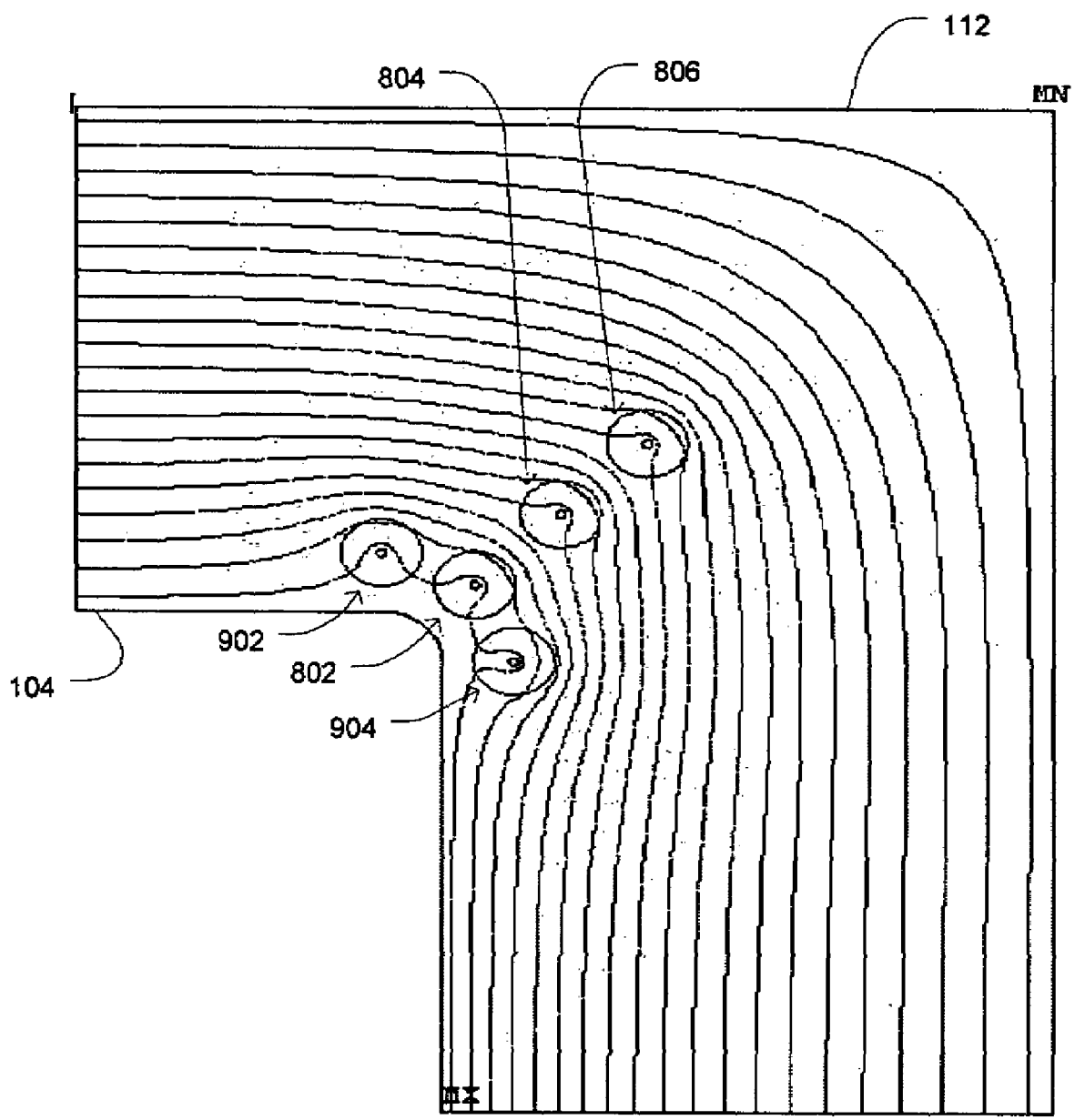
FIG. 10 is a plot of equipotential lines for an embodiment consistent with FIG. 9.

FIG. 10 illustrates plots of equipotential lines of one simulated active grading embodiment consistent with FIG. 9 to illustrate how the embodiment of FIG. 9 modifies an electric field about the terminal structure 104. In this simulated embodiment, each insulated conductor 902, 802, 904, 804, 806 is a high voltage cable with a 0.25 inch diameter conductor disposed within a 4.0 inch diameter solid insulator. The terminal structure 104 and the conductors 903, 803, 905 closest to the terminal structure were each energized to 600 kV. Conductor 805 was energized to 80% of the terminal voltage or 480 kV, while conductor 807 was energized to 60% of the terminal voltage or 360 kV. The simulated results revealed a maximum electrical stress in the insulators closest to the terminal structure of 148 kV/inch, and the maximum electrical stress in air was 45 kV/inch. A good quality plastic insulator can withstand the 148 kV/inch electrical stress, which would otherwise be far too high for air to withstand.

Figure 11:
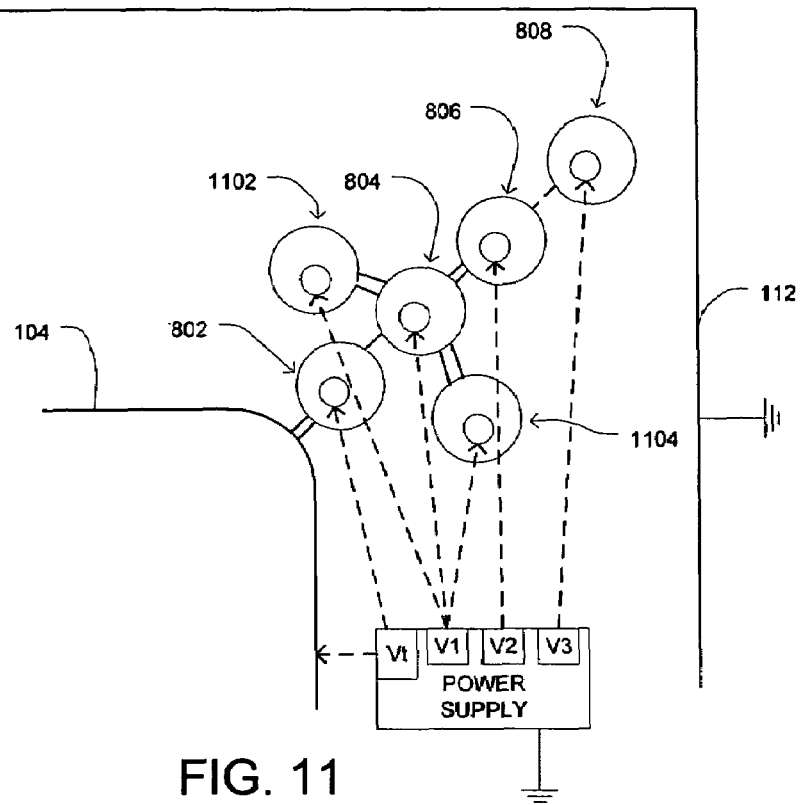
FIGS. 11 and 12 are cross sectional views of further embodiments having a plurality of insulated conductors.

FIG. 11 illustrates yet another embodiment where the insulated conductors 1102, 804, and 1104 are arranged in an arc similar to the arc of the insulated conductors 902, 802, 904 of FIG. 9, yet displaced a further distance from the terminal structure than the embodiment of FIG. 9.

Figure 12:
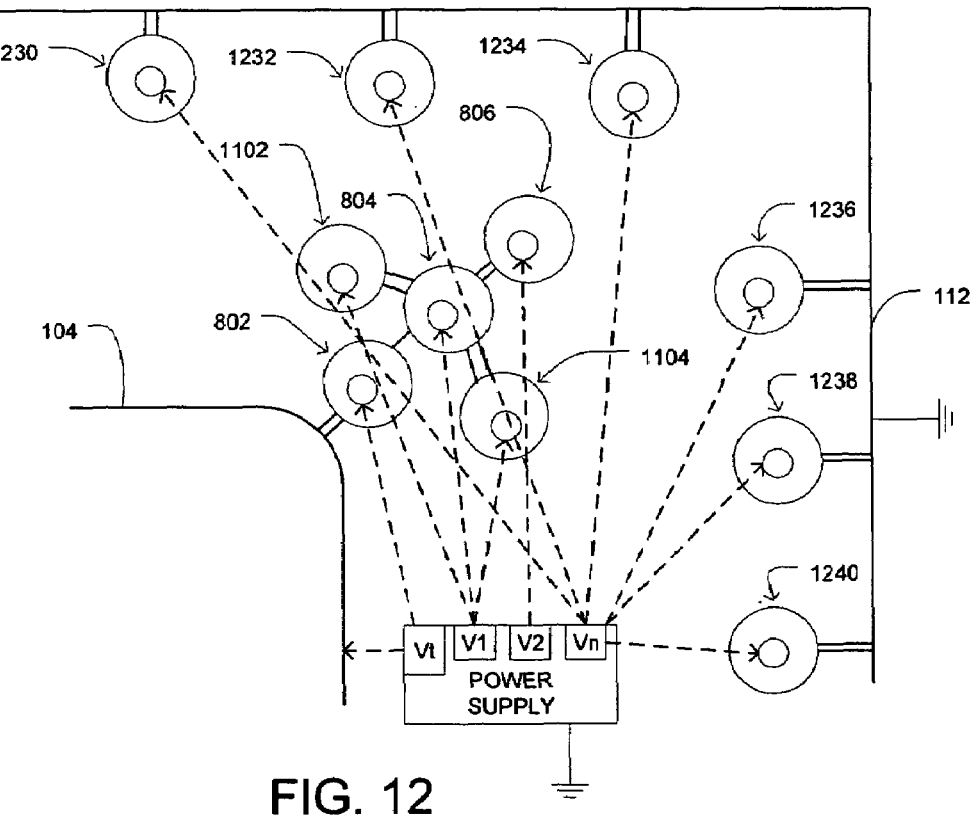

FIG. 12 illustrates yet another embodiment where at least one insulated conductor is supported by the grounded enclosure 112. For example, in the embodiment of FIG. 12, six insulated conductors 1230, 1232, 1234, 1236, 1238, and 1240 may be supported by the grounded enclosure 112. For active grading, the conductor of the insulted conductor 802 may receive the terminal voltage (Vt), the conductors of the insulated conductors 1102, 804, and 1104 may receive voltage V1, the conductor of the insulated conductor 806 may receive voltage V2, and the conductors of the insulated conductors 1230, 1232, 1234, 1236, 1238, and 1240 receive voltage Vn, where Vt>V1>V2>Vn.

Figure 13:
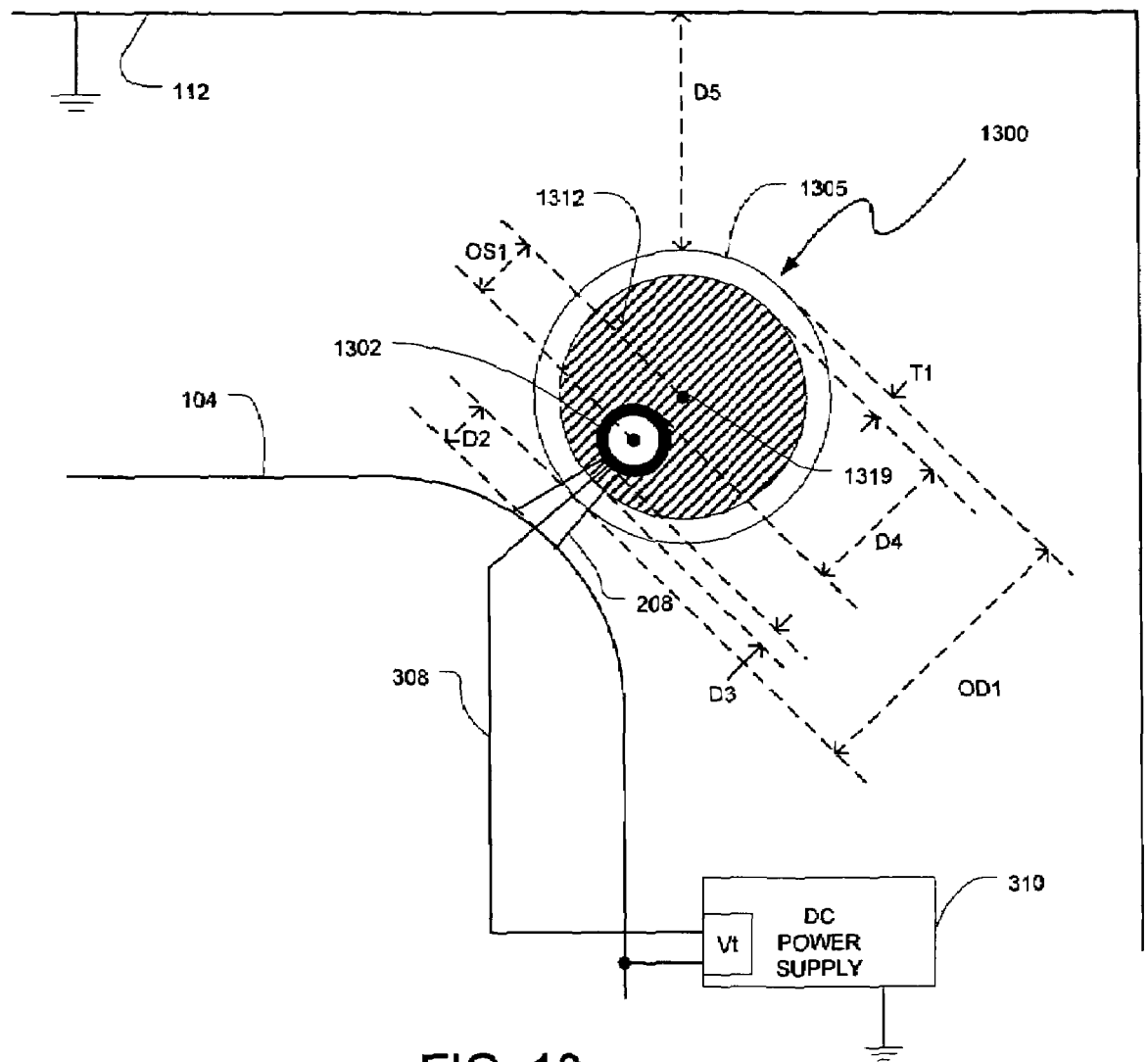
FIG. 13 is a cross sectional view of another embodiment of an insulated conductor having one tubular member.

Turning to FIG. 13, a cross sectional view of an embodiment of an insulated conductor 1300 having a tubular member 1305 is illustrated. The tubular member 1305 defines an interior portion having a conductor 1302 disposed therein. The tubular member 1305 may be fabricated of chlorinated polyvinyl chloride (CPVC), polyvinylidene difluoride (PVDF), ethylene chlorotrifluoroethylene (ECTFE), polytetrafluoroethylene (PTFE), or a polyimide (e.g., kapton). The CPVC, PVDF, and ECTFE plastic materials meet flammability specifications of different organizations such as Factory Mutual Specification 4910 (FM4910), and Underwriters Laboratory Specification 94-V0 (UL94-V0), which both specify standards to reduce the risk of fire and smoke. The conductor 1302 may also be a tubular member and may be fabricated of any variety of conductive materials such as metal.

A filler insulator 1312 may be disposed within the interior portion defined by the tubular member 1305. The filler insulator 312 may completely fill or partially fill the interior portion and combinations of differing filler insulators may be utilized. If the filler 1312 is completely sealed within a FM4910 conforming tubular member 1305, the filler 1312 does not need to be in conformance with the FM4910 specification.

One filler insulator 1312 may be a solid material such as syntactic foam. The syntactic foam can include hollow glass spheres and/or polymer pellets dispersed about a filling compound such as epoxy, silicone, or resin. Another filler insulator 1312 may include a gas. In one embodiment, the gas may be pressurized air. In some instances, a gas such as carbon dioxide ($CO_2$) or sulphur hexafluoride ($SF_6$) may be utilized and such gases may not need to be pressurized depending on their non pressurized dielectric strength. One combination of filler insulators 1312 may include a solid such as syntactic foam contacting the conductor 1302, with a gas such as pressurized air or $SF_6$ filling the remainder of the interior volume defined by the tubular member 1305.

The geometry of the tubular member 1305 may be selected so the electric field stress at the exterior surface of the tubular member 1305 is less than or equal to a selected design limit for air to safely accommodate, e.g., 45 kV/inch in one instance. The outside diameter (OD1) of the tubular member 1305 may range between 8 inches and 16 inches in some embodiments. The outside diameter (OD1) may also be selected to have a common size such as 12.7 inches with a wall thickness (T1) of 0.687 inches to be compliant with a size Schedule 80 pipe. The outside diameter of the conductor 1302 may range in size from 0.25 inches to 6.0 inches in some embodiments. The conductor 1302 may have a center that is offset from the center 1319 of the tubular member 1305 by an offset distance (OS1) ranging from 0 to about 3.0 inches depending on the available space within the tubular member 1305 and the diameter of the conductor 1302.

In one particular embodiment, the outside diameter (OD1) of a CPVC tubular member 1305 is 11 inches with a wall thickness (T1) of 0.5 inches. The outside diameter of the conductor 1302 in this particular embodiment is 4 inches and the offset distance (OS1) is 2.5 inches. Therefore, the distance (D3) between the conductor 1302 and the interior surface of the tubular member 1305 is only 0.5 inches and the distance (D4) between the conductor 1302 and an opposing interior surface of the tubular member is 5.5 inches in this particular embodiment. The bracket 208 may have a length to enable the insulated conductor 1300 to be positioned a distance (D2) of 1.5 inches from an exterior portion of the terminal structure 104.

Figure 14:
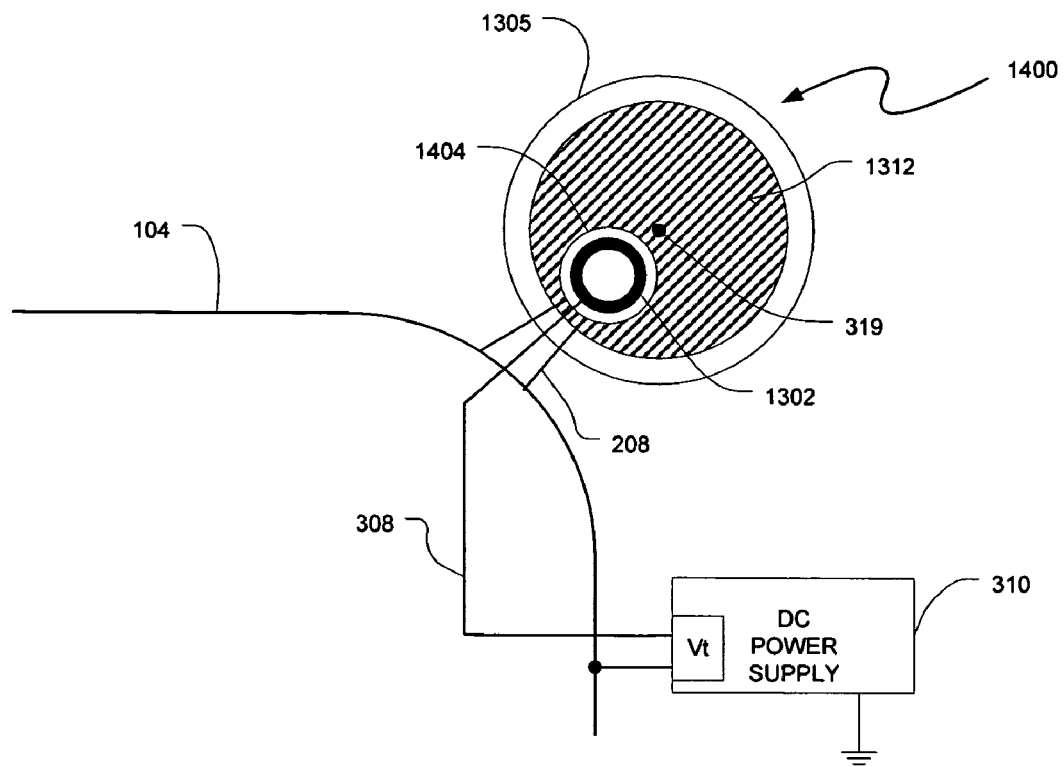
FIG. 14 is a cross sectional view of another embodiment of an insulated conductor having two tubular members.

FIG. 14 is a cross sectional view of another embodiment of an insulated conductor 1400. The insulated conductor 1400 has a first tubular member 1305 and a second tubular member 1404 disposed within the interior portion defined by the first tubular member 1305. Components of FIG. 14 similar to FIG. 13 and other embodiments are labeled similarly and hence any repetitive description is omitted herein for clarity.

The second tubular member 1404 may be a solid insulator fabricated of CPVC, PVDF, ECTFE, PTFE, or a polyimide. The conductor 1302 may have an outside diameter slightly less than the inside diameter of the second tubular member 1404 so the conductor 1302 touches the interior surface of the second tubular member 1404. It is desirable to have no air gaps between the outside of the conductor 1302 and the inside of the second tubular member 1404. In practice, a tubular member 1404 may be selected and the inside of the tubular member 1404 may be coated with a conductive paint. This may sometimes be referred to as "metalizing" the interior surface of the tubular member 1404. The second tubular member 1404 may reduce the electric stress at the exterior surface of the conductor 1302 to be much less than 80 kV/inch.

Figure 15:
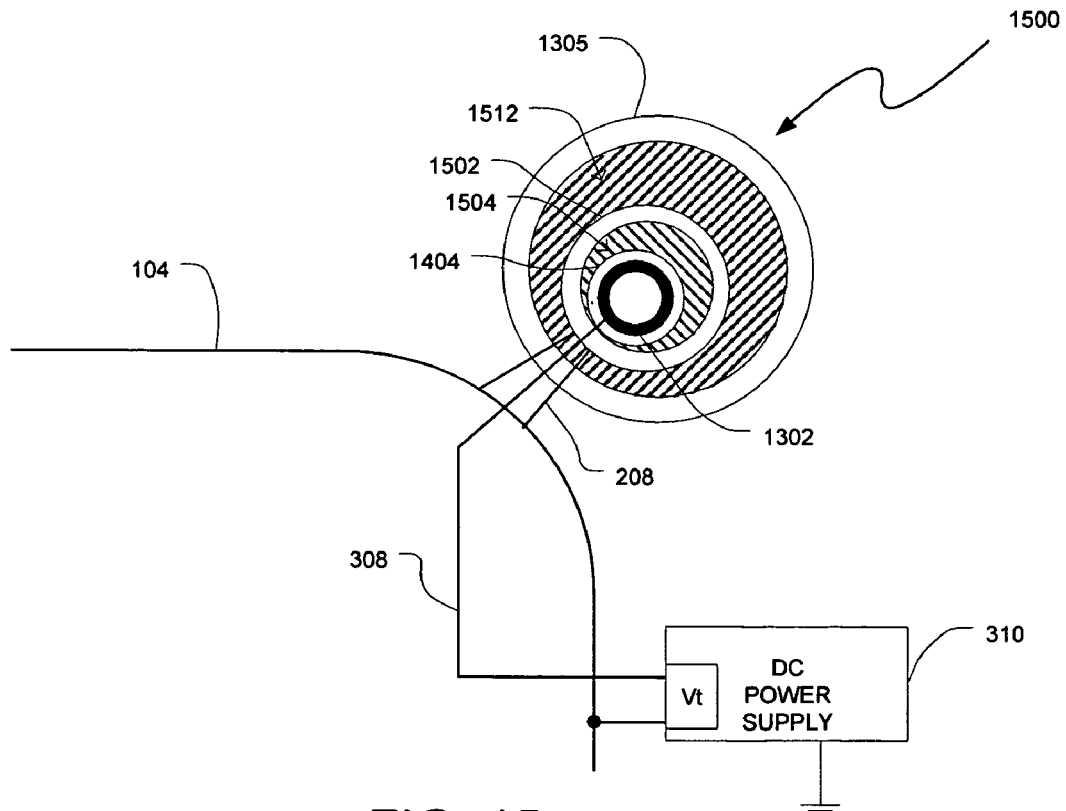
FIG. 15 is a cross sectional view of another embodiment of an insulated conductor having three tubular members.

FIG. 15 is a cross sectional view of another embodiment of an insulated conductor 1500. The insulated conductor 1500 has a first tubular member 1305, a second tubular member 1404 and a third tubular member 1502. Other components of FIG. 15 similar to FIGS. 13 and 14 and other embodiments are labeled similarly and hence any repetitive description is omitted herein for clarity.

The third tubular member 1502 may be disposed within the interior portion defined by the first tubular member 1305, and the second tubular member 1404 may be further disposed within the third tubular member 1502. A first filler insulator 1504 may be disposed within the interior portion defined by the third tubular member 1502, and a second filler insulator 1512 may be disposed within the interior portion defined by the first tubular member 1305. In one embodiment, a pressurized gas, e.g., air, nitrogen, $SF_6$, etc., may be utilized as the filler for the first 1504 and second 1512 filler insulator. The outside diameter of the third tubular member 1502 may then be selected so that the volume of gas needed for the first filler insulator 1504 is less than the volume of gas needed for the second filler insulator 1512, and enables a higher gas pressure to be utilized for the first filler 1504 without invoking stringent pressure vessel code requirements.

Figure 16:
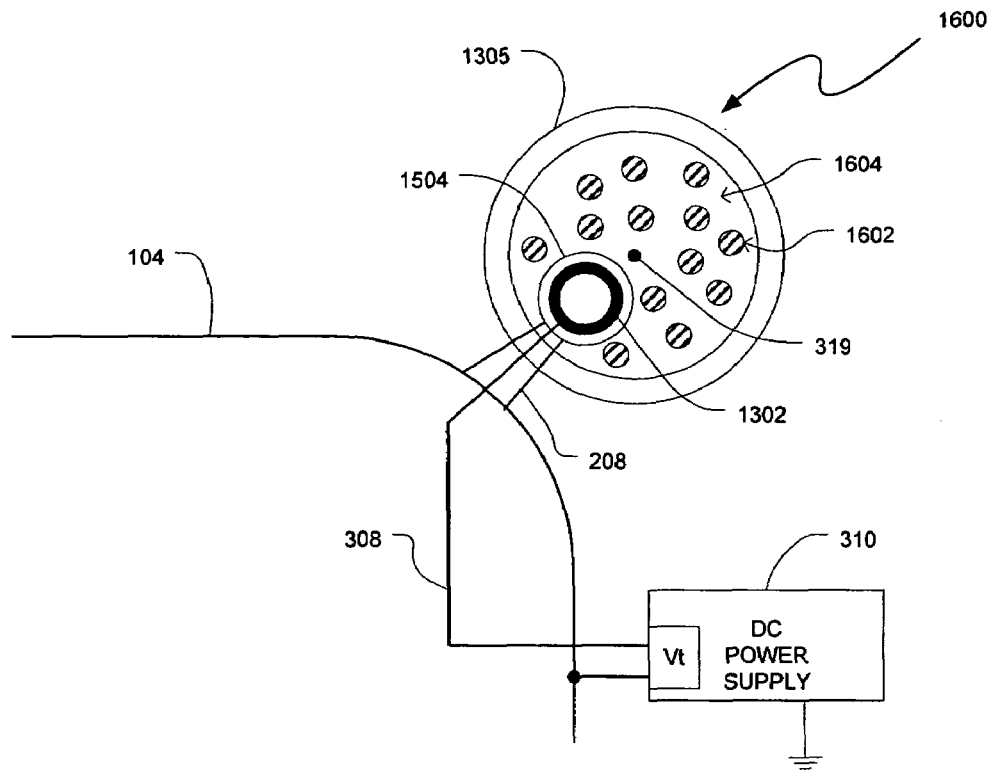
FIG. 16 is a cross sectional view of another embodiment of an insulated conductor having two tubular members and a composite filler.

FIG. 16 illustrates yet another embodiment of an insulated conductor 1600. The insulated conductor 1600 may include a composite insulator including solid fillers 1602 dispersed in a pressurized gas. The solid fillers 1602 may include a plurality of solid modules, e.g., halar granules and/or glass spheres, which serves as an insulator and also reduce the remaining volume 1604 to be filled with a pressurized gas. The pressurized gas can include pressurized air or $SF_6$ above 1.5 atm absolute without invoking stringent pressure vessel code requirements given the reduced volume of gas needed in the volume 1604.

Figure 17:
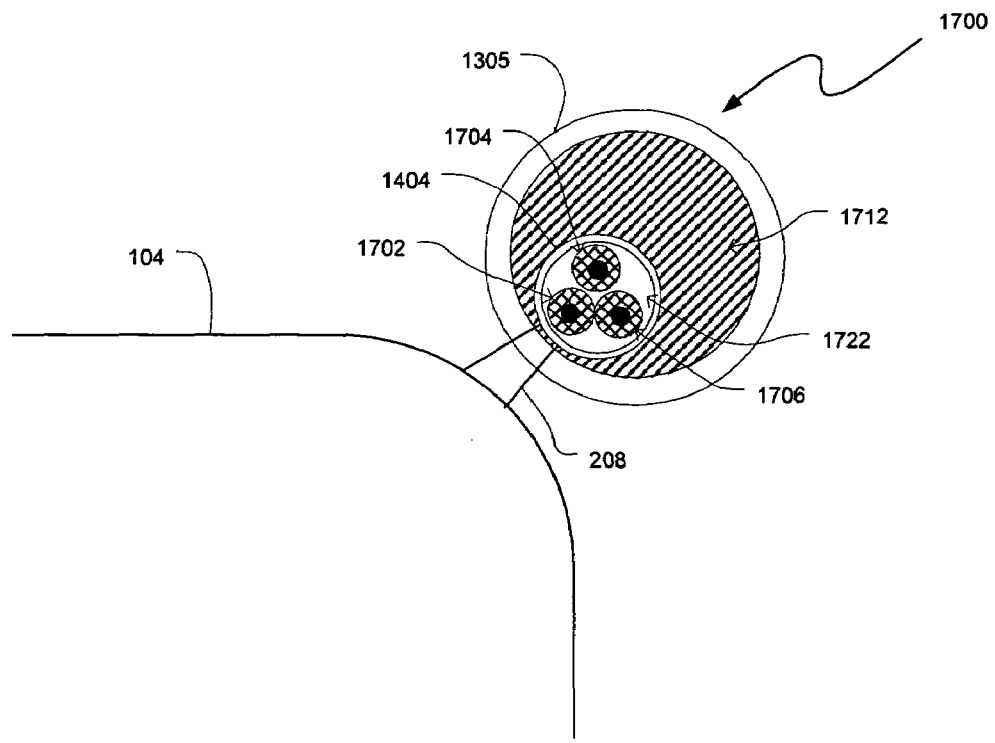
FIG. 17 is a cross sectional view of another embodiment of an insulated conductor.

FIG. 17 illustrates yet another embodiment of an insulator conductor 1700. The insulated conductor 1700 is similar to the insulated conductor of FIG. 14 except that it has a plurality of high voltage cables 1702, 1704, 1706 disposed within an interior volume defined by the second tubular member 1404 as opposed to the individual conductor 1302 of FIG. 14. Other components of FIG. 17 similar to FIG. 14 and other embodiments are labeled similarly and hence any repetitive description is omitted herein for clarity. Each of the high voltage cables 1702, 1704, 1706 includes a conductor enclosed in an associated insulator. The high voltage cables may be commercially available or custom made high voltage cables. Since the high voltage cables 1702, 1704, 1706 are individually insulated, this provides another layer of insulation protection against other elements having compromised dielectric strength. For example, the high voltage cables 1702, 1704, 1706 may be utilized with welded tubular members, e.g., members 1404 and 1305, having compromised dielectric strength at the welding junctions.

A first filler insulator 1722 may be disposed within the interior portion defined by the second tubular member 1404 and a second filler insulator 1712 may be disposed within the interior portion defined by the first tubular member 1305. The first filler insulator 1722 may include non pressurized air, $SF_6$, microballoons, granules, etc. and the second filler insulator 1712 may include the same.

Having thus described at least one illustrative embodiment, various alterations, modifications, and improvements will readily occur to those skilled in the art. Such alterations, modifications, and improvements are intended to be within and scope of the disclosure. Accordingly, the foregoing description is by way of example only and is not intended as limiting.

What is claimed is:

1. An ion implanter comprising:
   an ion source configured to provide an ion beam;
   a terminal structure defining a cavity, said ion source at least partially disposed within said cavity; and
   an insulated conductor disposed proximate an exterior portion of said terminal structure to modify an electric field about said terminal structure, said insulated conductor having an insulator with a dielectric strength greater than 75 kilovolts (kV)/inch disposed about a conductor, wherein said exterior portion of said terminal structure comprises a periphery of a top edge of said terminal structure and a periphery of a bottom edge of said terminal structure, and wherein said insulated conductor comprises a top insulated conductor disposed about said periphery of said top edge and a bottom insulated conductor disposed about said periphery of said bottom edge.

2. The ion implanter of claim 1, wherein said conductor is configured to be energized to a first voltage and said terminal structure is configured to be energized to said first voltage.

3. The ion implanter of claim 2, wherein said first voltage is at least 400 kV.

4. The ion implanter of claim 1, further comprising a bracket coupled to said terminal structure and said insulated conductor, said bracket configured to support said insulated conductor proximate said exterior portion.

5. The ion implanter of claim 4, wherein said bracket comprises a conductive material, and said bracket is coupled to said conductor of said insulated conductor.

6. The ion implanter of claim 4, wherein said bracket comprises a nonconductive material.

7. The ion implanter of claim 4, wherein said bracket has a length to enable said insulated conductor to be positioned a distance from said exterior portion.

8. The ion implanter of claim 7, wherein said distance is at least 1.5 inches.

9. The ion implanter of claim 1, wherein said exterior portion further comprises a periphery of said terminal structure between said top edge and said bottom edge, and wherein said insulated conductor further comprises an intermediate insulated conductor disposed about said periphery of said terminal structure between said top edge and said bottom edge.

10. The ion implanter of claim 1, wherein said insulator comprises a solid insulator.

11. An ion implanter comprising:
   an ion source configured to provide an ion beam;
   a terminal structure defining a cavity, said ion source at least partially disposed within said cavity;
   an insulated conductor disposed proximate an exterior portion of said terminal structure to modify an electric field about said terminal structure, said insulated conductor having an insulator with a dielectric strength greater than 75 kilovolts (kV)/inch disposed about a conductor; and
   a plurality of grading conductors disposed within said insulator, each of said plurality of grading conductors radially disposed a different distance from said conductor away from said exterior portion of said terminal structure, each of said plurality of grading conductors having an arcuate shape.

12. The ion implanter of claim 11, wherein each of said plurality of grading conductors has a differing arcuate length.

13. The ion implanter of claim 11, wherein each of said plurality of grading conductors has a same arcuate length.

14. The ion implanter of claim 11, wherein each of said plurality of grading conductors has an arcuate length, and wherein radial lines from said conductor to a center of said arcuate length of each of said grading conductors are at different angles from each other.

15. The ion implanter of claim 11, wherein each of said plurality of grading conductors are electrically floating.

16. The ion implanter of claim 11, wherein said plurality of grading conductors comprises a first grading conductor radially disposed a first distance from said conductor, a second grading conductor radially disposed a second distance from said conductor, and a third grading conductor radially disposed a third distance from said conductor, wherein said first distance is less than said second distance, and said second distance is less than said third distance, wherein said first grading conductor is configured to receive a first grading voltage, said second grading conductor is configured to receive a second grading voltage, and said third grading conductor configured to receive a third grading voltage, wherein said first grading voltage is greater than said second grading voltage, and said second grading voltage is greater than said third grading voltage.

17. An ion implanter comprising:
an ion source configured to provide an ion beam;
a terminal structure defining a cavity, said ion source at least partially disposed within said cavity;
an insulated conductor disposed proximate an exterior portion of said terminal structure to modify an electric field about said terminal structure, said insulated conductor having an insulator with a dielectric strength greater than 75 kilovolts (kV)/inch disposed about a conductor, wherein said exterior portion comprises an edge of said terminal structure, and wherein said insulated conductor comprises at least a first, a second, and a third insulated conductor disposed about said edge, and wherein said edge has an arcuate shape and said first, second, and third insulated conductors are positioned in an arc consistent with said arcuate shape of said edge.

18. An ion implanter comprising:
an ion source configured to provide an ion beam;
a terminal structure defining a cavity, said ion source at least partially disposed within said cavity; and
an insulated conductor disposed proximate an exterior portion of said terminal structure to modify an electric field about said terminal structure, said insulated conductor having an insulator with a dielectric strength greater than 75 kilovolts (kV)/inch disposed about a conductor, wherein said insulator comprises a first tubular member defining an interior portion, said conductor disposed within said interior portion.

19. The ion implanter of claim 18, wherein said first tubular member comprises chlorinated polyvinyl chloride (CPVC), polyvinylidene difluoride (PVDF), ethylene chlorotrifluoroethylene (ECTFE), polytetrafluoroethylene (PTFE), or a polyimide.

20. The ion implanter of claim 18, wherein said insulator further comprises a filler insulator disposed within said interior portion of said first tubular member.

21. The ion implanter of claim 20, wherein said filler insulator comprises pressurized air.

22. The ion implanter of claim 18, wherein said insulator further comprises a second tubular member, wherein said second tubular member is disposed within said interior portion of said first tubular member.

23. The ion implanter of claim 22, wherein said insulator further comprises a third tubular member, wherein said third tubular member is disposed within said interior portion of said first tubular member, and said second tubular member is further disposed within an interior portion defined by said third tubular member.

* * * * *